(12) United States Patent
Drapkin et al.

(10) Patent No.: US 6,359,485 B1
(45) Date of Patent: *Mar. 19, 2002

(54) DIFFERENTIAL INPUT RECEIVER AND METHOD FOR REDUCING NOISE

(75) Inventors: Oleg Drapkin, North York; Grigori Temkine, Toronto, both of (CA)

(73) Assignee: ATI International SRL, Barbados (KN)

( * ) Notice: Subject to any disclaimer, the term of this patent is extended or adjusted under 35 U.S.C. 154(b) by 0 days.

This patent is subject to a terminal disclaimer.

(21) Appl. No.: 09/614,084

(22) Filed: Jul. 11, 2000

Related U.S. Application Data

(63) Continuation of application No. 09/210,969, filed on Dec. 14, 1998, now Pat. No. 6,133,772.

(51) Int. Cl.[7] ............................................... H03K 3/286
(52) U.S. Cl. ........................ 327/206; 327/205; 327/68; 327/80
(58) Field of Search ............................ 327/52, 54, 65, 327/68, 77–81, 205, 206; 330/282, 291

(56) References Cited

U.S. PATENT DOCUMENTS

| | | | |
|---|---|---|---|
| 4,783,607 A | 11/1988 | Hsieh | 307/405 |
| 5,229,720 A | 7/1993 | Nishimura | 330/260 |
| 5,266,884 A | 11/1993 | Agiman | 327/72 |
| 5,675,269 A | 10/1997 | Nakauchi | 327/77 |
| 5,748,534 A | 5/1998 | Dunlap et al. | 327/54 |
| 5,798,663 A | 8/1998 | Fugere et al. | 327/205 |

OTHER PUBLICATIONS

A.G.P. Design Guide: Covering 1X, 2X and 4 X Modes and 1.5 Volt and 3.3. Volt Signaling (Revision 1.0, Intel Corporation, Aug. 1988).

Accelerated Graphics Port Interface Specification (Revision 2.0, Intel Corporation, May 4, 1998).

*Primary Examiner*—Timothy P. Callahan
*Assistant Examiner*—An T. Luu
(74) *Attorney, Agent, or Firm*—Vedder, Price, Kaufman & Kammholz

(57) ABSTRACT

An integrated circuit and method utilizes a differential input receiver having a first input that receives an input signal. A reference voltage adjustment circuit produces a variable reference signal for the second input of a differential input receiver. A feedback path is provided from the output of the differential input receiver to an input of the reference voltage adjustment circuit. The reference voltage adjustment circuit dynamically varies the variable reference voltage signal to facilitate hysteresis. The variable reference voltage signal is lowered in the case of a high input signal, and raised in the case of a low input signal.

6 Claims, 2 Drawing Sheets

DIFFERENTIAL INPUT RECEIVER AND METHOD FOR REDUCING NOISE

RELATED CO-PENDING APPLICATIONS

This is a related application to the following co-pending applications, filed on even date, having the same inventors and assigned to instant assignee:

1. Single Gate Oxide Differential Receiver and Method, having Ser. No. 09/211,469;
2. Voltage Supply Discriminator and Method, having Ser. No. 09/211,115; and
3. Pre-buffer Voltage Level Shifting Circuit and Method, having Ser. No. 09/211,496.

This is a continuation of application Ser. No. 09/210,969 filed on Dec. 4, 1998, now U.S. Pat. No. 6,133,772, entitled "Differential Input Receiver and Method for Reducing Noise" by Drapkin et al., and owned by instant assignee.

FIELD OF THE INVENTION

The invention relates generally to differential input receivers and more particularly to integrated circuit differential input receivers having some form of hysteresis.

BACKGROUND OF THE INVENTION

Graphics controller chips, like many integrated circuit devices, utilize CMOS, logic cores, and associated input/output (I/O) pads as part of their circuit makeup. I/O pads include, for example, input/output buffers coupled to a common pad or pin. There is a constant challenge to continuously design smaller, faster and more complicated integrated circuits to provide increased functionality for multimedia applications and other applications. Typically, the logic core operates at a different supply voltage than the I/O pads. For example, with logic cores having gate lengths of 0.25 urn and gate oxide thickness' of 50 angstroms, a core logic supply voltage may be 2.5 volts. Corresponding supply voltages for the input/output pads, however, may be different supply voltages such as 3.3 volts. However, future generation chips require faster speeds and lower power consumption, hence, lower supply voltages so that the I/O pads can switch at faster frequencies.

Also, integrated circuits must often provide compatibility with older versions of interface circuits. As a result, an integrated circuit may require that the I/O pads operate at either a 3.3 volt level, or for example, at a lower 1.5 volt level. The gate length and gate thickness of I/O pad transistors must also typically be decreased to provide faster circuits that draw less current. With multilevel supply voltages, multi-gate oxide devices are often used to provide the requisite logic levels and overvoltage protection. However, a problem arises when multi-gate oxide transistors are used on the same chip. Using differing gate oxide thickness' requires additional fabrication processes and, hence, results in higher fabrication costs. Moreover, the larger gate oxide thickness can slow the device down unnecessarily. For low voltage CMOS signaling, the input/output pad must also be designed to prevent static leakage and prevent damage due to gate-source or gate-drain overvoltage.

Input/output interfaces that receive high speed CMOS signals, such as I/O pad receivers may send false signals because of signal reflections, power or ground noise and other sources of noise. A conventional input receiver circuit for such I/O interfaces uses a Schmidt Trigger receiver with hysteresis. One example is shown FIG. 1. As shown, a Schmidt Trigger receiver receives an input signal 12 which is coupled to a cascaded pair of pmos FET transistors 14 and cascaded nmos FET transistor 16. Feedback transistors 18 and 20 provide hysteresis so that ambient noise on the input signal is filtered. However, such Schmidt Trigger receivers are temperature sensitive and voltage supply fluctuates may pass through to the output. As such, noise on the voltage supply may not be suitably filtered.

It has been recommended to use differential input receivers with a voltage reference of a first stage of an input receiver to meet timing requirements of high speed input/output interfaces. For example, accelerated graphics port (AGP) design guides set forth by Intel Corporation (Revision 1.0, August, 1998) describes an input receiver having a differential input buffer with an external voltage reference. Such a differential input receiver is suggested to have a multi-stage input or folded cascade receiver configuration (AGP Design Guide Ref. 1.0, Section 1.4, pages 25–30.) Such a differential input receiver may have advantages over conventional single input Schmidt Trigger receivers since power supply noise may be reduced. However, noise on the input signal may not be suitably filter. Moreover, it is difficult to combine single input Schimdt Trigger input receiver and the differential input receiver.

Consequently, a need exists for an integrated circuit differential input receiver that can accommodate an external reference voltage as an input and an input signal as another input while providing suitable noise reduction.

DETAILED DESCRIPTION OF A PREFERRED EMBODIMENT OF THE INVENTION

Briefly, an integrated circuit and method utilizes a differential input receiver having a first input that receives an input signal. A reference voltage adjustment circuit produces a variable reference signal for the second input of a differential input receiver. A feedback path is provided from the output of the differential input receiver to an input of the reference voltage adjustment circuit. The reference voltage adjustment circuit dynamically varies the variable reference voltage signal to facilitate hysteresis. The variable reference voltage signal is lowered in the case of a high input signal, and raised in the case of a low input signal.

Figure 2A:
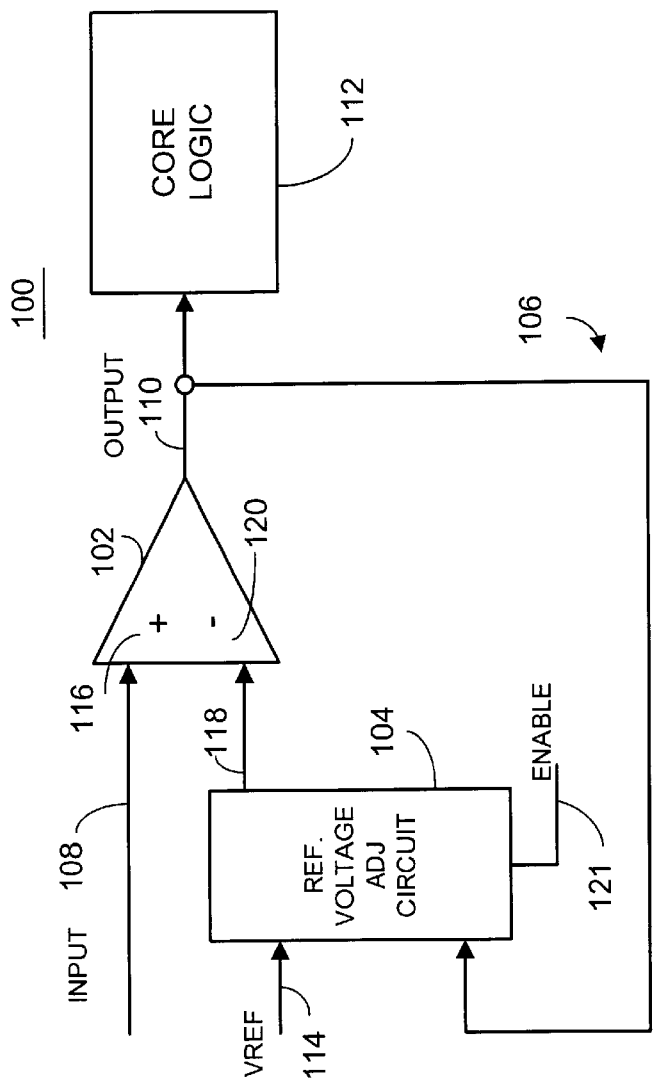
FIG. 2a is a block diagram illustrating one embodiment of an integrated circuit differential input receiver in accordance with one embodiment of the invention.

FIG. 2a shows an integrated circuit receiver 100 having a differential input receiver 102, a reference voltage adjustment circuit 104 and a feedback path 106. The integrated circuit receiver 100 receives an input signal 108 and outputs an output signal 110 to other core logic 112, such as a CMOS logic core for a graphics controller chip or other suitable integrated circuit. The integrated circuit receiver 100 also receives a DC reference signal 114. A first input 116 of the differential input receiver receives the input signal 108. The reference voltage adjustment circuit 104 produces a variable reference signal 118 for a second input 120 of the differential input receiver 102. A feedback path 106 is provided from the output of the differential input receiver 102 to provide input to the reference voltage adjustment circuit 104. An enable signal 121 may also be used to enable and disable the reference voltage adjustment circuit 104, if desired.

Figure 2B:
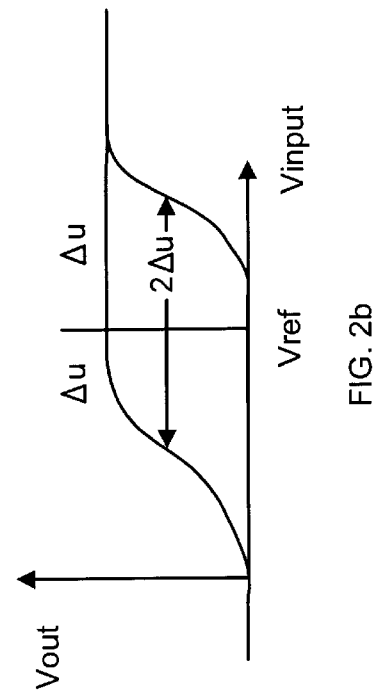
FIG. 2b is a graphic representation of a hysteresis graph.

The reference voltage adjustment circuit 104 dynamically varies the variable reference voltage signal 118 downwards when the input signal 108 increases. Conversely, the variable reference voltage adjustment circuit 104 dynamically varies the variable reference voltage signal 118 upwards when the input signal 108 decreases. Referring to FIG. 2b, for example, when the input signal 108 switches from a low to a high, the variable reference voltage signal 118 is increased by a hysteresis factor (Δ u) and as the input signal 108 switches from logic high to a logic low level, the variable reference voltage 118 is decreased by the hysteresis factor (Δ u). The hysteresis window is typically two times (Δ u). The reference voltage adjustment circuit 104 also includes an enable circuit that provides selective activation to the reference adjustment circuit based on the voltage level of the enable signal 121. The feedback path and corresponding reference voltage adjustment circuit effectively combines the advantages of a first differential stage which allows for common mode rejection, direct switching point control and other advantages, with hysteresis protection against input voltage glitches and power supply glitches.

Figure 3:
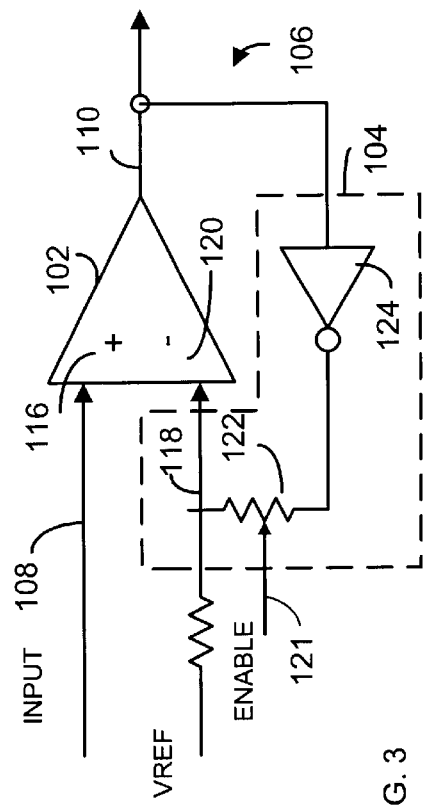
FIG. 3 is a circuit diagram representing one embodiment of an integrated circuit differential input receiver in accordance with the invention.

FIG. 3 shows one embodiment of the integrated circuit receiver 100 wherein the reference voltage adjustment circuit 104 includes a variable impedance circuit 122 and an inverter 124. A variable impedance circuit 122 is part of a feedback path and has an output coupled to the input 120 of the differential receiver 102. The variable impedance circuit 122 may be any suitable impedance varying circuit such as a variable resistor or any other suitable circuit.

Figure 4:
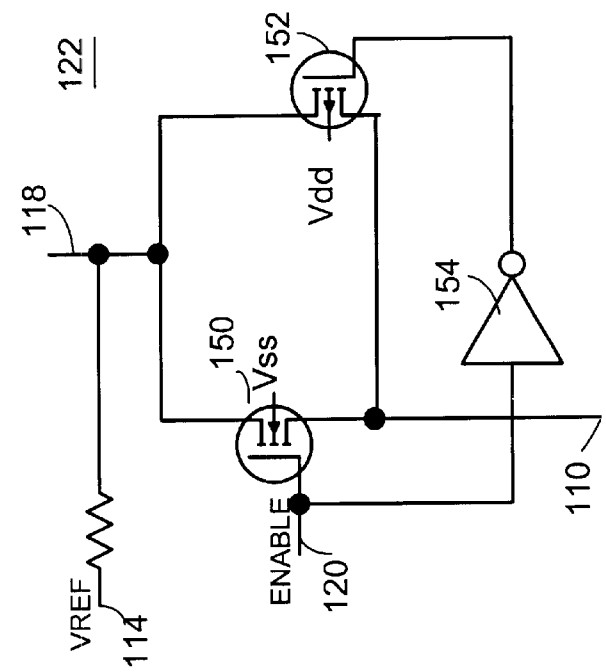
FIG. 4 is a circuit diagram illustrating one embodiment of a reference voltage adjustment circuit in accordance with one embodiment of the invention.
Figure 1:
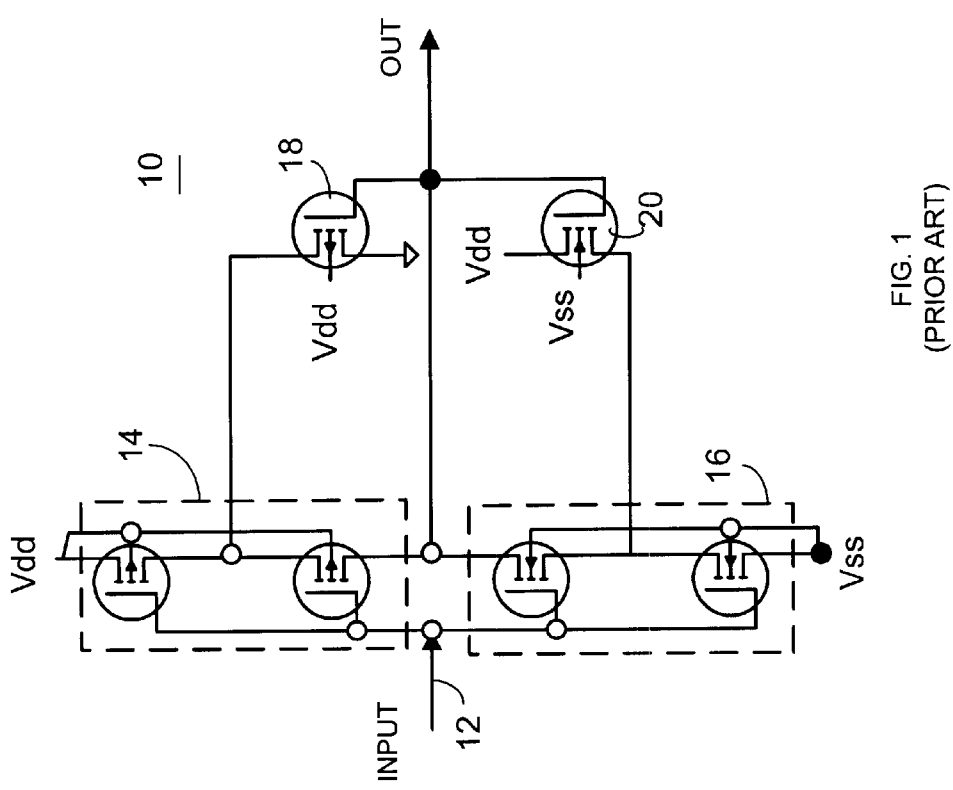
FIG. 1 is a circuit diagram of prior art Schmidt Trigger input receiver.

FIG. 4 shows one example of a variable impedance circuit 122 having an nmos transistor 150 with a gate controlled by the enable signal 121. A source of the nmos transistor 150 is coupled to the input 118 of the differential receiver and has its drain operatively coupled to the output signal 110 from the differential receiver 102. When the enable signal 121 is a logic high level, the nmos transistor 150 and pmos transistor 152 are turned on and the value of the output signal 110 determines the amount of resistance or current flow to the nrmos transistor 150 and 152. The inverter 154 serves to also turn on transistor 152 when the enable signal is in a logic high level. As such, the amount of current flow and impedance varies to vary the reference voltage 118 depending upon the output signal.

As previously noted, the operation of the system shown in FIG. 2a operates such that a differential input receiver receives an input signal. The circuit produces a variable reference signal for a second input of the differential receiver. The circuit provides a feedback path from an output of a differential input receiver to an input of a reference voltage adjustment circuit. They system dynamically varies the variable reference voltage signal downwards when the input signal increases and varies the variable reference voltage signal upwards when the input signal decreases. The above identified circuit may be of any suitable form including a combination of hardware and software, programmable logic or any other suitable mechanism.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An integrated circuit receiver comprising:

a differential input receiver having a first input that receives a digital input signal;

a reference voltage adjustment circuit, operatively coupled to a second input of the differential input receiver that produces a variable reference signal to the differential input receiver; and a feedback path from an output of the differential input receiver to an input of the reference voltage adjustment circuit wherein the reference voltage adjustment circuit dynamically varies the variable reference voltage signal to facilitate hysteresis.

2. The receiver of claim 1 wherein the reference voltage adjustment circuit dynamically varies the variable reference voltage signal downwards when the input signal increases and varies the variable reference voltage signal upwards when the input signal decreases.

3. The receiver circuit of claim 1 wherein the reference voltage adjustment circuit includes a variable impedance circuit operatively coupled as part of a feedback path from the output of the differential input receiver to the second input of the differential receiver.

4. The receiver circuit of claim 1 wherein the reference voltage adjustment circuit includes:

an nmos transistor having a gate controlled by an enable signal, a source operatively coupled to the second input of the differential receiver and a drain operatively responsive to the output signal from the differential input receiver;

a pmos transistor having a gate operatively controlled by an inverted enable signal, a source operatively coupled to the second input of the differential input receiver, and a drain operatively responsive to the output signal from the differential input receiver; and an inverter having an input operatively coupled to receive the enable signal and an output operative to output the inverted enable signal.

5. A method for receiving a signal using an integrated circuit receiver comprising the steps of:

receiving a digital input signal by a differential input receiver having a first input;

producing a variable reference signal for a second input of the differential input receiver; and providing a feedback path from an output of the differential input receiver to an input of the reference voltage adjustment circuit, wherein the reference voltage adjustment circuit dynamically varies the variable reference voltage signal to facilitate hysteresis.

6. The method of claim 5 including dynamically varying the variable reference voltage signal downwards when the input signal increases and varying the variable reference voltage signal upwards when the input signal decreases.

* * * * *